US011404459B2

(12) United States Patent
Lei

(10) Patent No.: US 11,404,459 B2
(45) Date of Patent: Aug. 2, 2022

(54) IMAGE SENSOR PIXEL UNIT AND MANUFACTURING METHOD THEREFOR, AND IMAGE SENSOR AND IMAGE SENSING ARRAY

(71) Applicant: Ningbo ABAX Sensing Electronic Technology Co., Ltd., Ningbo (CN)

(72) Inventor: Shuyu Lei, Ningbo (CN)

(73) Assignee: Ningbo ABAX Sensing Electronic Technology Co., Ltd., Ningbo (CN)

( * ) Notice: Subject to any disclaimer, the term of this patent is extended or adjusted under 35 U.S.C. 154(b) by 0 days.

(21) Appl. No.: 17/035,225

(22) Filed: Sep. 28, 2020

(65) Prior Publication Data

US 2021/0013248 A1    Jan. 14, 2021

Related U.S. Application Data

(63) Continuation of application No. PCT/CN2018/106142, filed on Sep. 18, 2018.

(30) Foreign Application Priority Data

Apr. 16, 2018    (CN) .......................... 201810338281.X

(51) Int. Cl.
H01L 27/146 (2006.01)
H04N 5/355 (2011.01)
H04N 5/3745 (2011.01)

(52) U.S. Cl.
CPC .... *H01L 27/1461* (2013.01); *H01L 27/14689* (2013.01); *H04N 5/3559* (2013.01); *H04N 5/37452* (2013.01)

(58) Field of Classification Search
CPC ...... H01L 27/146–14893; H01L 21/00; H04N 5/3559; H04N 5/37452; H04N 5/374
See application file for complete search history.

(56) References Cited

U.S. PATENT DOCUMENTS

2011/0292380 A1    12/2011 Bamji
2015/0264283 A1*   9/2015 Kobayashi ........ H01L 27/14612
                                                  257/229

FOREIGN PATENT DOCUMENTS

CN    103716558 A    4/2014
CN    107068716 A    8/2017

OTHER PUBLICATIONS

International Search Report issued in International Application No. PCT/CN2018/106142 dated Dec. 18, 2018 (2 pages).

(Continued)

*Primary Examiner* — Nelson Garces
(74) *Attorney, Agent, or Firm* — Ziegler IP Law Group, LLC

(57) ABSTRACT

A pixel unit and a manufacturing method thereof, a sensor, and a sensor array are provided. The pixel unit comprises: a photosensitive unit, configured to generate a photo-generated carrier according to received radiation; at least two transmission units, connected between the photosensitive unit and at least two floating diffusion nodes, and configured to transfer the photo-generated carrier from the photosensitive unit to the at least two floating diffusion nodes; and the at least two floating diffusion nodes, configured to store and output the photo-generated carrier generated by the photosensitive unit. Among the at least two floating diffusion nodes, the floating diffusion node spaced by more transmission units from the photosensitive unit has a lower electric potential. Forming an electric potential difference between at least two stages of floating diffusion nodes facilitates high-speed transfer of the photo-generated carrier, increases charge transfer speed, and thereby improves charge transfer efficiency.

10 Claims, 4 Drawing Sheets

(56) References Cited

OTHER PUBLICATIONS

Written Opinion issued in International Application No. PCT/CN2018/106142 dated Dec. 18, 2018 (3 pages).

* cited by examiner

IMAGE SENSOR PIXEL UNIT AND MANUFACTURING METHOD THEREFOR, AND IMAGE SENSOR AND IMAGE SENSING ARRAY

CROSS-REFERENCE TO RELATED APPLICATIONS

This application is a continuation application of International Application No. PCT/CN2018/106142, filed on Sep. 19, 2018, which is based on and claims priority to Chinese Patent Application No. 201810338281.X, filed on Apr. 16, 2018, the entire contents of which are incorporated herein by reference.

TECHNICAL FIELD

One or more embodiments of the present invention relate to the technical field of microelectronics. More specifically, one or more embodiments of the present invention relate to a pixel unit and a manufacturing method thereof, a sensor, and a sensor array.

BACKGROUND

This section is to provide background or context for one or more embodiments of the present invention stated in the claims. The description included in this section is not admitted to be the prior art.

At present, complementary metal oxide semiconductor (CMOS) sensors (such as CMOS image sensor) have attracted much attention due to their low costs and adaption of batch production. The requirements for output signals of image sensors are high in many fields such as long-distance high-precision ranging, high dynamic imaging, and high frame frequency imaging.

However, due to the surface defects of device structures in the existing image sensors, common mode offsets such as dark current and noise are prone to occur inside the device structures, so that the image sensors cannot output high-performance image signals with higher signal-to-noise ratios. In addition, the existing image sensors also have low charge transfer efficiency, so that the existing image sensors cannot meet the requirements for the performance of sensors in many fields. Therefore, the existing image sensors cannot meet the requirements for sensors in many fields such as long-distance high-precision ranging, high dynamic imaging, and high frame frequency imaging.

SUMMARY

In a first aspect of one or more embodiments of the present invention, a pixel unit is provided, the pixel unit comprises: a photosensitive unit, configured to generate a photo-generated carrier according to received radiation; at least two transmission units, connected between the photosensitive unit and at least two floating diffusion nodes or connected between at least two floating diffusion nodes, and configured to transfer the photo-generated carrier from the photosensitive unit to the at least two floating diffusion nodes; and the at least two floating diffusion nodes, configured to store and output the photo-generated carrier generated by the photosensitive unit; wherein among the at least two floating diffusion nodes, the floating diffusion node that is spaced by more transmission units from the photosensitive unit has a lower electric potential.

In the pixel unit provided by one or more embodiments of the present invention, forming of an electric potential difference between at least two stages of floating diffusion nodes facilitates implementing high-speed transfer of the photo-generated carrier between a plurality of stages of floating diffusion nodes, and facilitates increasing the charge transfer speed, thereby improving the charge transfer efficiency.

In one or more embodiments of the present invention, the at least two floating diffusion nodes comprise at least one floating diffusion node provided with a charge storage region and an electric potential adjustment layer, and the electric potential adjustment layer is arranged at a surface of the charge storage region.

The electric potential adjustment layer arranged at the surface of the charge storage region can not only achieve the effect of electric potential adjustment, but also suppress a surface state of the floating diffusion nodes and reduce the generation of dark current, thereby improving the storage effect of the charge storage region.

In one or more embodiments of the present invention, a region in the electric potential adjustment layer that is further away from the photosensitive unit has a lower electric potential. In this way, it facilitates to form an electric potential change in the floating diffusion nodes, so as to realize directional movement of the photo-generated carrier in the floating diffusion nodes.

In one or more embodiments of the present invention, the electric potential adjustment layer comprises a channel threshold adjustment region; in the electric potential adjustment layer, the channel threshold adjustment region is furthest away from the photosensitive unit, and the channel threshold adjustment region has the lowest electric potential. In one or more embodiments, the channel threshold adjustment region may be arranged at an end of the electric potential adjustment layer closer to the next stage of the floating diffusion node.

In one or more embodiments of the present invention, the channel threshold adjustment region is arranged within the coverage of the transmission unit connected between the at least two floating diffusion nodes. This facilitates to the transfer of the photo-generated carrier from the charge storage region to the next floating diffusion node through the transmission unit.

In one or more embodiments of the present invention, a doping concentration of a P-type material in the electric potential adjustment layer decreases in a direction of decreasing electric potential, or/and, the doping concentration of the P-type material in the channel threshold adjustment region is the lowest.

In one or more embodiments of the present invention, the transmission units connected between the photosensitive unit and the at least two floating diffusion nodes are connected to the surface of the charge storage region.

In one or more embodiments of the present invention, each of the at least two floating diffusion nodes has the same depth; and the pixel unit further comprises a substrate epitaxial layer, and the depth of the at least two floating diffusion nodes is one fiftieth to one tenth of the depth of the substrate epitaxial layer.

In one or more embodiments of the present invention, the at least two transmission units are etched polysilicon gates.

In a second aspect of one or more embodiments of the present invention, a manufacturing method of a pixel unit is provided, the method comprises: providing a substrate epitaxial layer, forming a photosensitive unit in the substrate epitaxial layer, forming at least two transmission units on the substrate epitaxial layer, forming at least two floating diffusion nodes in the substrate epitaxial layer by non-uniform doping of a semiconductor material, wherein the transmission units are connected between the photosensitive unit and the at least two floating diffusion nodes, and wherein among the at least two floating diffusion nodes, the floating diffusion node that is spaced by more transmission units from the photosensitive unit has a lower electric potential.

In one or more embodiments of the present invention, the forming at least two floating diffusion nodes in the substrate epitaxial layer by non-uniform doping of a semiconductor material comprises: forming an electric potential adjustment layer at a surface of the substrate epitaxial layer by non-uniform doping of the semiconductor material; and forming a charge storage region under the electric potential adjustment layer, wherein the electric potential adjustment layer and the charge storage region constitute at least one floating diffusion node.

In one or more embodiments of the present invention, the region in the electric potential adjustment layer that is further away from the photosensitive unit has a lower electric potential.

In one or more embodiments of the present invention, the electric potential adjustment layer comprises a channel threshold adjustment region, in the electric potential adjustment layer, the channel threshold adjustment region is furthest away from the photosensitive unit, and the channel threshold adjustment region has the lowest electric potential.

In one or more embodiments of the present invention, the channel threshold adjustment region is arranged within the coverage of the transmission unit connected between the at least two floating diffusion nodes.

In one or more embodiments of the present invention, the doping concentration of a P-type material in the electric potential adjustment layer decreases in a direction of decreasing electric potential, or/and, the doping concentration of the P-type material in the channel threshold adjustment region is the lowest.

In one or more embodiments of the present invention, the transmission units connected between the photosensitive unit and the at least two floating diffusion nodes are connected to the surface of the charge storage region.

In one or more embodiments of the present invention, each of the at least two floating diffusion nodes has the same depth; and the manufacturing method further comprises a substrate epitaxial layer, and the depth of the at least two floating diffusion nodes is one fiftieth to one tenth of the depth of the substrate epitaxial layer.

In one or more embodiments of the present invention, the at least two transmission units are etched polysilicon gates.

In a third aspect of one or more embodiments of the present invention, a CMOS sensor is provided, and a pixel unit in the CMOS sensor comprises: a photosensitive unit, configured to generate a photo-generated carrier according to received radiation; at least two transmission units, connected between the photosensitive unit and at least two floating diffusion nodes, and configured to transfer the photo-generated carrier from the photosensitive unit to the at least two floating diffusion nodes; and the at least two floating diffusion nodes, configured to store and output the photo-generated carrier generated by the photosensitive unit; wherein among the at least two floating diffusion nodes, the floating diffusion node that is spaced by more transmission units from the photosensitive unit has a lower electric potential. The pixel unit is used to perform any item provided by the embodiments corresponding to the first aspect.

In a fourth aspect of one or more embodiments of the present invention, a sensor is provided, and a pixel unit in the sensor comprise: a photosensitive unit, configured to generate a photo-generated carrier according to received radiation; at least two transmission units, connected between the photosensitive unit and at least two floating diffusion nodes, and configured to transfer the photo-generated carrier from the photosensitive unit to the at least two floating diffusion nodes; and the at least two floating diffusion nodes, configured to store and output the photo-generated carrier generated by the photosensitive unit; wherein among the at least two floating diffusion nodes, the floating diffusion node that is spaced by more transmission units from the photosensitive unit has a lower electric potential. The pixel unit is used to perform any item provided by the embodiments corresponding to the first aspect.

In a fifth aspect of one or more embodiments of the present invention, a sensor array is provided, the sensor array comprise a plurality of pixel units, wherein the plurality of pixel units may be sensors of any of the embodiments corresponding to the third aspect or the fourth aspect, or the plurality of sensors may also be CMOS sensors similar to the sensor of any of the embodiments corresponding to the third aspect or the fourth aspect. The pixel unit is used to perform any item provided by the embodiments corresponding to the first aspect.

In the technical solutions provided by one or more embodiments of the present invention, forming an electric potential difference between a plurality of stages of the floating diffusion nodes facilitates implementing high-speed transfer of the photo-generated carrier between the plurality of stages of floating diffusion nodes, and facilitates increasing the charge transfer speed, thereby improving the charge transfer efficiency.

BRIEF DESCRIPTION OF DRAWINGS

The above and other objectives, features, and advantages of the exemplary embodiments of the present invention will become readily comprehensible by reading the following detailed description with reference to the accompanying drawings. In the drawings, several embodiments of the present invention are illustrated in an exemplary but non-limiting manner, in which.

Figure 1:
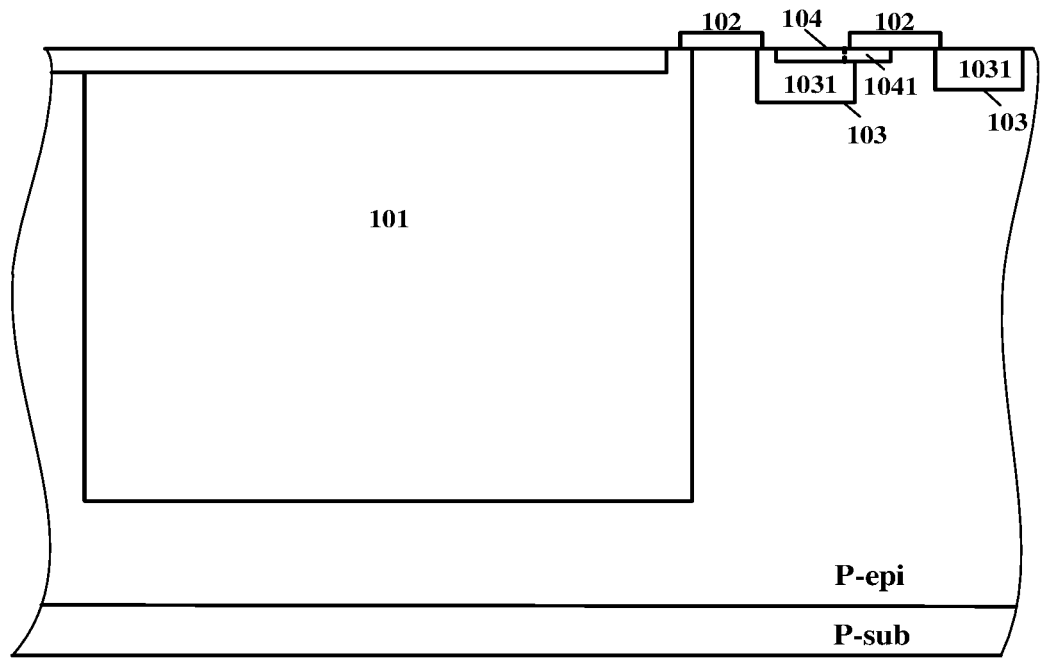
FIG. 1 illustrates a schematic structural diagram of a pixel unit according to one or more embodiments of the present invention.

The meanings of the reference numbers in the figures are: 101—photosensitive unit; 102—transmission unit; 103—floating diffusion node; 104—electric potential adjustment layer; 1031—charge storage region; 1041—channel threshold adjustment region;

400—substrate epitaxial layer; 401—channel threshold adjustment region; 402—transmission gate; 403—charge storage region; 404—floating diffusion node; 4012—electric potential adjustment layer.

The same or corresponding reference numbers in the drawings denote the same or corresponding parts.

DETAILED DESCRIPTION

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Due to the surface defects of device structures in the existing image sensors, common mode offsets such as dark current and noise are prone to occur inside the device structures, so that the image sensors cannot output high-performance image signals with higher signal-to-noise ratios. In addition, the existing image sensors also have low charge transfer efficiency, so that the existing image sensors cannot meet the requirements for the performance of sensors in many fields. Therefore, the existing image sensors cannot meet the requirements for sensors in many fields such as long-distance high-precision ranging, high dynamic imaging, and high frame frequency imaging.

In order to improve the structures of the existing image sensors and improve the performance of the image sensors, one or more embodiments of the present invention provide a pixel unit and a manufacturing method thereof, a sensor, and a sensor array. Wherein, the pixel unit, the sensor and the sensor array are based on the same inventive concept. Since the pixel unit, the sensor and the sensor array solve problems according to similar principles, the implementations of the pixel unit, the sensor and the sensor array may be referred to each other, and repeated parts are not described repeatedly.

The technical solutions provided by one or more embodiments of the present invention are applicable to a charge transfer scenario, that is, a photo-generated carrier transfer scenario, especially a charge transfer scenario in a sensor, such as a charge transfer scenario in a receiving side sensor during long-distance high-precision ranging on an object to be detected. Taking the charge transfer scenario in the sensor as an example, photo-generated carriers are transferred from a photosensitive unit to floating diffusion nodes through transmission units, and then transferred from the floating diffusion nodes to a post processing unit connected to the pixel unit through the transmission units.

The technical solutions provided by one or more embodiments of the present invention may be applied to various systems, especially a system that requires high charge transfer efficiency or a system that requires high sensor performance. The various systems applied by one or more embodiments of the present invention may be systems in various fields such as long-distance high-precision ranging, high-dynamic imaging, and high frame frequency imaging. For example, the applicable systems may be autonomous driving systems, mapping systems, drone tracking systems, machine vision systems, game systems, artificial intelligence systems, etc.

One or more embodiments of the present invention will be described in detail below with reference to the accompanying drawings. It should be noted that the display order of the embodiments of the present invention only represents the order of the embodiments, and does not represent the merits of the technical solutions provided by the embodiments.

One or more embodiments of the present invention provides a pixel unit. FIG. 1 illustrates a schematic structural diagram of a pixel unit. The pixel unit includes at least a photosensitive unit 101, transmission units 102, and floating diffusion nodes 103, wherein:

the photosensitive unit 101 is configured to generate a photo-generated carrier according to received radiation;

at least two transmission units 102 are connected between the photosensitive unit 101 and the at least two floating diffusion nodes 103, and configured to transfer the photo-generated carrier from the photosensitive unit 101 to the at least two floating diffusion nodes 103;

the at least two floating diffusion nodes 103 are configured to store and output the photo-generated carrier generated by the photosensitive unit 101;

wherein among the at least two floating diffusion nodes 103, the floating diffusion node 103 that is spaced by more transmission units 102 from the photosensitive unit 101 has a lower electric potential.

In the pixel unit provided by one or more embodiments of the present invention, forming an electric potential difference between a plurality of stages of the floating diffusion nodes facilitates implementing high-speed transfer of the photo-generated carrier between the plurality of stages of the floating diffusion nodes, and facilitates increasing the charge transfer speed, thereby improving the charge transfer efficiency.

The pixel unit according to one or more embodiments of the present invention may be applied to image sensors, in particular to the sensors in many fields such as long-distance high-precision ranging, high dynamic imaging, and high frame frequency imaging. The embodiments of the present invention do not limit the application of the pixel unit to other sensors. The number of pixel units included in the sensor here may be one or more. When there is a plurality of pixel units, the sensor may include M rows and N columns of pixel units, where M and N are positive integers.

The at least two transmission units 102 are configured to transfer the photo-generated carrier from the photosensitive unit 101 to the at least two floating diffusion nodes 103, which may be understood here that the at least two transmission units 102 are configured to implement the transfer process of the photo-generated carrier between the photosensitive unit 101 and the floating diffusion nodes 103, and also to implement the transfer process of the photo-generated carrier between a plurality of stages of the floating diffusion nodes 103. It should be noted that one or more embodiments of the present invention do not limit the connection relationship among the at least two transmission units 102, the photosensitive unit 101, and the at least two floating diffusion nodes 103. The connection relationship is exemplified by two transmission units 102 and two floating diffusion nodes 103, wherein one of the two transmission units 102 may be connected between the photosensitive unit 101 and one floating diffusion node 103, and the other transmission unit 102 may be connected between the two floating diffusion nodes 103, as shown in FIG. 1. The numbers of transmission units and floating diffusion nodes in the pixel unit according to one or more embodiments of the present invention may be the same or different, which is not limited in the embodiments of the present invention.

In one or more embodiments of the present invention, the photosensitive unit 101 involved may be a photodiode, a laser diode, or other photosensitive device. The transmission units 102 are configured to transfer the photo-generated carrier from the photosensitive unit 101 to the at least two floating diffusion nodes 103. The transmission units 102 include but are not limited to transmission gates, transfer nodes, and charge transmission gates. Optionally, the at least two transmission units 102 are etched polysilicon gates. Taking the transmission gate as an example of the transmission unit 102, a semiconductor film is grown on an upper surface of a P-type material epitaxial layer to form a gate oxide layer, polysilicon deposited in the gate oxide layer is photo-etched to obtain a polysilicon gate, and then the polysilicon gate is etched to obtain the transmission gate. Optionally, the semiconductor film includes but is not limited to a silicon dioxide film.

In one or more embodiments of the present invention, the at least two floating diffusion nodes 103 are configured to store and output the photo-generated carrier generated by the photosensitive unit 101. Optionally, the at least two floating diffusion nodes 103 include at least one floating diffusion node 103 provided with a charge storage region 1031 and an electric potential adjustment layer 104, and the electric potential adjustment layer 104 is arranged at a surface of the charge storage region 1031. The electric potential adjustment layer 104 arranged at the surface of the charge storage region 1031 can not only achieve the effect of electric potential adjustment, but also suppress a surface state of the floating diffusion node to reduce the generation of dark current, thereby improving the storage effect of the charge storage region 1031. Optionally, the transmission units 102 connected between the photosensitive unit 101 and the at least two floating diffusion nodes 103 are connected to the surface of the charge storage region 1031.

It should be understood that, in one or more embodiments of the present invention, it is not limited that each of the at least two floating diffusion nodes 103 is provided with an electric potential adjustment layer 104, and only a part of the at least two floating diffusion nodes 103 may be provided with electric potential adjustment layers 104. When the number of floating diffusion nodes 103 is two, the electric potential adjustment layer 104 may be provided in each of the two floating diffusion nodes 103, or only in one of the floating diffusion nodes 103 which is connected to the photosensitive unit 101. When the number of floating diffusion nodes 103 is three, the electric potential adjustment layer 104 may be provided in each of the three floating diffusion nodes 103, or only in the floating diffusion node 103 connected to the photosensitive unit 101 among the three floating diffusion nodes 103, or only in two floating diffusion nodes 103 spaced by fewer transmission units 102 from the photosensitive unit 103 among the three floating diffusion nodes 103.

The region in the electric potential adjustment layer 104 that is further away from the photosensitive unit 101 has a lower electric potential, which facilitates rapid transfer of charges to next node. Further, the electric potential adjustment layer 104 includes a channel threshold adjustment region 1041. The electric potential of the channel threshold adjustment region 1041 is lower than the electric potential of other regions in the electric potential adjustment layer 104, which facilitates to reduce the channel threshold, realizes the transfer of photo-generated carrier from the current floating diffusion node 103 to the next floating diffusion node 103 through the channel threshold adjustment region 1041, accelerates the transfer of the photo-generated carrier, and improves the transfer efficiency of the photo-generated carrier between the floating diffusion nodes 103. In a possible implementation manner, in the electric potential adjustment layer 104, the channel threshold adjustment region 1041 is furthest away from the photosensitive unit 101, and the channel threshold adjustment region 1041 has the lowest electric potential. Correspondingly, the channel threshold adjustment region 1041 may be arranged at an end of the electric potential adjustment layer 104 closer to the next floating diffusion node. Optionally, the channel threshold adjustment region 1041 is arranged within the coverage of the transmission unit 102 connected between the at least two floating diffusion nodes 103, which facilitates to the transfer of photo-generated carrier from the charge storage region 1031 to the next floating diffusion node 103 through the transmission unit 102.

In one or more embodiments of the present invention, the doping concentration of a P-type material for the electric potential adjustment layer 104 decreases in a direction of decreasing electric potential. Preferably, the doping concentration of the P-type material in the channel threshold adjustment region 1041 is the lowest. In a possible implementation manner, the electric potential adjustment layer 104 is divided into a plurality of regions, the electric potential of each of the plurality of regions is different, and the doping concentration of the P-type material in each of the plurality of regions is also different. In one or more embodiments, the electric potential in the electric potential adjustment layer 104 decreases smoothly, and the doping concentration of the P-type material in the electric potential adjustment layer 104 decreases smoothly.

There are many methods for forming the electric potential adjustment layer 104 in one or more embodiments of the present invention. One method is to form the electric potential adjustment layer 104 by doping twice. Boron ions are first doped in the epitaxial layer to form the channel threshold adjustment region 1041, and then boron fluoride is doped on the basis of the channel threshold adjustment region 1041 to form other regions in the channel threshold adjustment region 1041, such that the concentration of boron ions in the electric potential adjustment layer 104 is higher than that in other regions of the channel threshold adjustment region 1041. In this way, a barrier potential difference is formed between the electric potential adjustment layer 104 and the other regions in the channel threshold adjustment region 1041, which provides a modulated electric field sufficient for transferring the photo-generated carrier to the next floating diffusion node, accelerates the transfer of the photo-generated carrier, and improves the transfer efficiency of the photo-generated carrier between the floating diffusion nodes 103.

The depth of each of the at least two floating diffusion nodes 103 may be the same. Optionally, the pixel unit further includes a substrate epitaxial layer.

Since each stage of the floating diffusion nodes 103 needs to store charges, if it is too deep, the energy of semiconductor doping may be too high, resulting in excessive energy consumption. Further, the depths of the at least two floating diffusion nodes 103 are one fiftieth to one tenth of the depth of the substrate epitaxial layer. Exemplarily, the depth of the epitaxial layer of the P-type doping material ranges from 10 to 20 μm, and the depths of the floating diffusion nodes 103 range from 0.2 to 2 μm. In one or more embodiments of the present application, it is not limited that the depths of the at least two floating diffusion nodes 103 are the same. In practical applications, the depths of the at least two floating diffusion nodes 103 may also be different.

Further, the depth of the electric potential adjustment layer 104 is one twentieth to one tenth of the depth of the floating diffusion node 103. Since the channel value adjustment region in the electric potential adjustment layer 104 is used to transfer the photo-generated carrier, the depth of the channel value adjustment region in the electric potential adjustment layer 104 may be preferably one tenth of the depth of the floating diffusion node 103.

Example 1

Taking the pixel unit shown in FIG. 1 as an example, the P-type semiconductor material is a phosphorous ion material, and the depths of the at least two floating diffusion nodes 103 are one twentieth of the depth of the epitaxial layer of the P-type semiconductor material. Phosphorous ions are injected as an N-type material. In order to meet the depth requirement, the energy for injecting the phosphorus ions is 0.1 keV, the concentration of the doping material injected with the phosphorus ions is $3\times10^{14}$ cm$^{-2}$, and the inclination is 2°.

The depths of the plurality of regions in the electric potential adjustment layer 104 are the same, and the depth of the electric potential adjustment layer 104 is one fiftieth of the depth of the floating diffusion node. Boron fluoride is injected into the channel threshold adjustment region 1041 to form the electric potential adjustment layer 104. In order to meet the depth requirement, the energy for injecting the boron fluoride is 0.1 keV, the concentration of the doping material injected with the boron fluoride is $2\times10^{11}$ cm$^{-2}$, and the inclination is 2°.

Example 2

Taking the pixel unit shown in FIG. 1 as an example, the depths of the at least two floating diffusion nodes 103 are one twenty-fifth of the depth of the epitaxial layer of the P-type semiconductor material. Phosphorous ions are injected as an N-type material. In order to meet the depth requirement, the energy for injecting the phosphorus ions is 40 keV, the concentration of the doping material injected with the phosphorus ions is $5\times10^{15}$ cm$^{-2}$, and the inclination is 0°.

The depths of the plurality of regions in the electric potential adjustment layer 104 are the same, and the depth of the electric potential adjustment layer 104 is one fifteenth of the depth of the floating diffusion node. Boron fluoride is injected into the channel threshold adjustment region 1041 to form the electric potential adjustment layer 104. In order to meet the depth requirement, the energy for injecting the boron fluoride is 50 keV, the concentration of the doping material injected with the boron fluoride is $4\times10^{12}$ cm$^{-2}$, and the inclination is 0°.

Example 3

Taking the pixel unit shown in FIG. 1 as an example, the depths of the at least two floating diffusion nodes 103 are one tenth of the depth of the epitaxial layer of the P-type semiconductor material. Phosphorous ions are injected as an N-type material. In order to meet the requirement of the sensor for the depth of the floating diffusion node, the energy for injecting the phosphorus ions is 80 keV, the concentration of the doping material injected with the phosphorus ions is $4.6\times10^{16}$ cm$^{-2}$, and the inclination is 0°.

The depths of the plurality of regions in the electric potential adjustment layer 104 are the same, and the depth of the electric potential adjustment layer 104 is one tenth of the depth of the floating diffusion node. Boron fluoride is injected into the channel threshold adjustment region 1041 to form the electric potential adjustment layer 104. In order to meet the depth requirement, the energy for injecting the boron fluoride is 100 keV, the concentration of the doping material injected with the boron fluoride is $3.4\times10^{13}$ cm$^2$, and the inclination is 0°.

For the pixel unit provided by one or more embodiments of the present invention, forming an electric potential difference between a plurality of stages of the floating diffusion nodes facilitates implementing high-speed transfer of the photo-generated carrier between the plurality of stages of the floating diffusion nodes, and facilitates increasing the charge transfer speed, thereby improving the charge transfer efficiency. In addition, the electric potential adjustment layer arranged at the surface of the charge storage region can also suppress the surface state of the floating diffusion node to reduce the generation of dark current, thereby improving the storage effect of the charge storage region.

Figure 2:
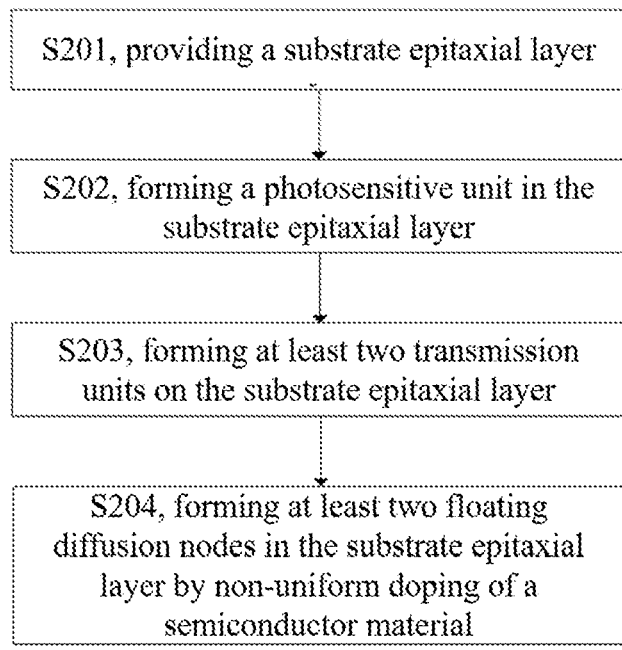
FIG. 2 illustrates a schematic flowchart of a manufacturing method of a pixel unit according to one or more embodiments of the present invention.

One or more embodiments of the present invention provide a manufacturing method of a pixel unit. As shown in FIG. 2, wherein the pixel unit is the pixel unit shown in FIG. 1, the manufacturing method of the pixel unit includes:

S201, providing a substrate epitaxial layer;

S202, forming a photosensitive unit in the substrate epitaxial layer;

S203, forming at least two transmission units on the substrate epitaxial layer; and S204, forming at least two floating diffusion nodes in the substrate epitaxial layer by non-uniform doping of a semiconductor material;

wherein the transmission units are connected between the photosensitive unit and the at least two floating diffusion nodes, or the transmission units are connected between the at least two floating diffusion nodes, and among the at least two floating diffusion nodes, the floating diffusion node that is spaced by more transmission units from the photosensitive unit has a lower electric potential.

In S201, a substrate epitaxial layer is provided; the substrate material is a semiconductor material, including but not limited to silicon, germanium, and gallium arsenide. Preferably, in one or more embodiments, the substrate epitaxial layer used may be an epitaxial layer of a P-type material substrate. The photosensitive unit in S202 may be a photodiode, a laser diode, or other photosensitive device. Preferably, in one or more embodiments, the photosensitive unit may be a photodiode.

There are many implementation manners for forming at least two transmission units on the substrate epitaxial layer in S203, one of which is that, specifically, a photoresist is used to cover a gate oxide layer of the substrate epitaxial layer, and the region to be etched on the gate oxide layer of the substrate epitaxial layer is exposed by conventional processing steps such as exposure and development to obtain a polysilicon gate; and then the polysilicon gate is etched on the exposed region by anisotropic etching to obtain a transmission gate, wherein the etching method may be dry etching or dry/wet etching.

The region in the electric potential adjustment layer that is further away from the photosensitive unit has a lower electric potential. The electric potential adjustment layer includes a channel threshold adjustment region, in the electric potential adjustment layer, the channel threshold adjustment region is furthest away from the photosensitive unit, and the channel threshold adjustment region has the lowest electric potential. Further, the channel threshold adjustment region is arranged within the coverage of the transmission unit connected between the at least two floating diffusion nodes. The doping concentration of the P-type material in the electric potential adjustment layer decreases in a direction of decreasing electric potential, or/and, the doping concentration of the P-type material in the channel threshold adjustment region is the lowest.

S204 involved in one or more embodiments of the present invention may be implemented by multiple manners, which are not limited herein. One possible implementation manner is that an electric potential adjustment layer is formed at the surface of the substrate epitaxial layer by non-uniform doping of a semiconductor material, and a charge storage region is formed under the electric potential adjustment layer, wherein the electric potential adjustment layer and the charge storage region constitute at least one floating diffusion node. It should be noted that one or more embodiments of the present invention do not limit the times of non-uniform doping of the semiconductor material. For example, when the non-uniform doping of the semiconductor material is carried out multiple times, a channel threshold adjustment region may be formed in the epitaxial layer by doping a P-type semiconductor material, an electric potential adjustment layer is formed by doping the P-type semiconductor material again, and finally a charge storage region is formed under the electric potential adjustment layer by doping an N-type semiconductor material. One or more embodiments of the present invention do not limit the implementation of non-uniform doping of the semiconductor material, for example, in-situ doping is available.

One or more embodiments of the present invention do not limit the order of steps S201 to S204; S204 may be executed before S203, or after S203, or simultaneously with S203.

Optionally, the transmission units connected between the photosensitive unit and the at least two floating diffusion nodes are connected to the surface of the charge storage region. Each of the at least two floating diffusion nodes has the same depth; and the manufacturing method further includes a substrate epitaxial layer, and the depths of the at least two floating diffusion nodes are one fiftieth to one tenth of the depth of the substrate epitaxial layer.

Optionally, the at least two transmission units are etched polysilicon gates.

Example 4

Figure 3:
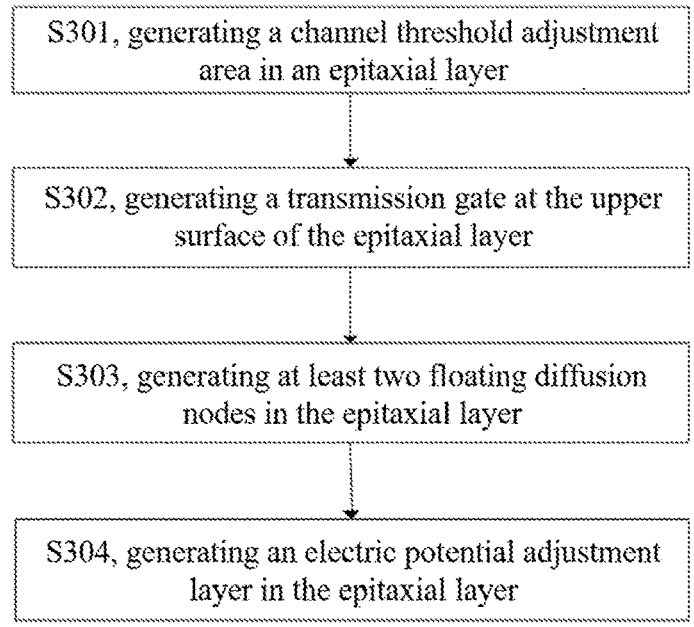
FIG. 3 illustrates a schematic flowchart of another manufacturing method of a pixel unit according to one or more embodiments of the present invention.
Figure 4:
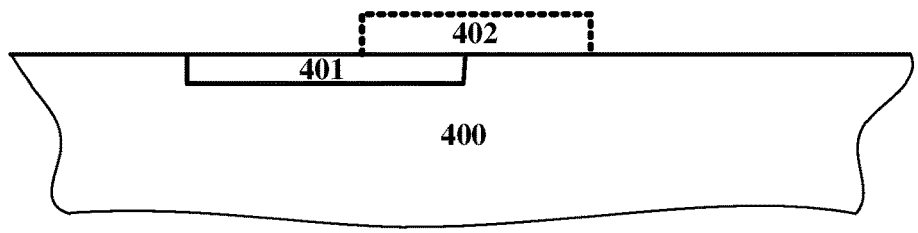
FIG. 4 to FIG. 7 illustrate a schematic structural diagram of a pixel unit in a manufacturing process of a pixel unit according to one or more embodiments of the present invention.

One or more embodiments of the present invention provide another manufacturing method of a pixel unit, as shown in FIG. 3, wherein the pixel unit is the pixel unit shown in FIG. 1, and the manufacturing method of the pixel unit includes the following steps:

S301: generating a channel threshold adjustment region in an epitaxial layer. Specifically, a P-type material is injected into an upper part of a P-type semiconductor material epitaxial layer 400 to form a channel threshold adjustment region 401, as shown in FIG. 4. Preferably, the energy for injecting boron ions into the P-type semiconductor material epitaxial layer may be 0.8 to 50 keV, the concentration of the doping material injected with the boron ions may be $1\times10^{11}$ to $2.1\times10^{13}$ cm$^{-2}$, and the inclination when the boron ions are injected may be 5° to 7°.

Figure 5:
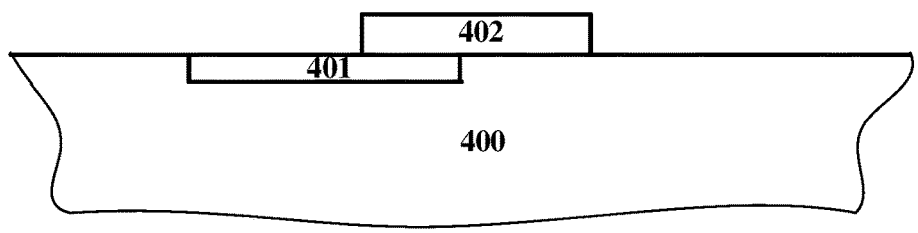

S302: generating a transmission gate at the upper surface of the epitaxial layer. Specifically, a gate oxide layer is grown on the P-type semiconductor material epitaxial layer 400, polysilicon deposited in the gate oxide layer is photo-etched to obtain a polysilicon gate, and the polysilicon gate is etched to obtain a transmission gate 402, as shown in FIG. 5.

S303: generating at least two floating diffusion nodes in the epitaxial layer.

Figure 6A:
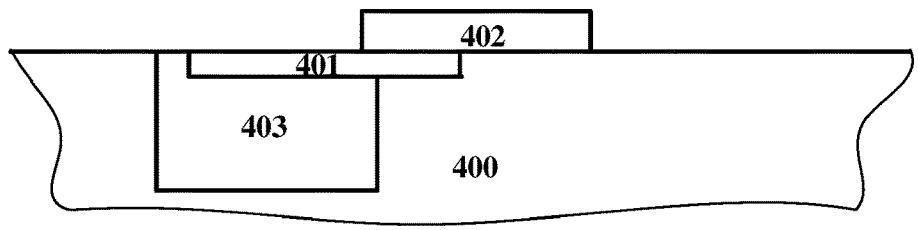
Figure 6B:
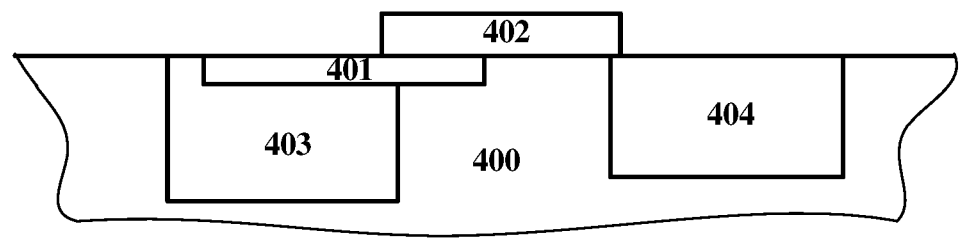

Specifically, an N-type material is injected into the P-type semiconductor material epitaxial layer 400 to form an N-type doped charge storage region 403 of one of the at least two floating diffusion nodes, as shown in FIG. 6A. Next, the N-type material is injected into the P-type semiconductor material epitaxial layer 400 again, to form the other N-type doped floating diffusion node 404 of the at least two floating diffusion nodes, as shown in FIG. 6B.

Optionally, the at least two floating diffusion nodes have the same depth, and the depth of the at least two floating diffusion nodes 103 is one tenth to one fiftieth of the depth of the P-type semiconductor material epitaxial layer. In one or more embodiments of the present invention, phosphorus ions are implanted as an N-type material. In order to meet the requirement of a sensor for the depth of the floating diffusion node, the energy for implanting the phosphorus ions is 0.1 to 80 keV, the concentration of the doping material implanted with the phosphorus ions is $4\times10^{14}$ to $4.6\times10^{16}$ cm$^{-2}$, and the tilt is 0° to 2°.

Figure 7:
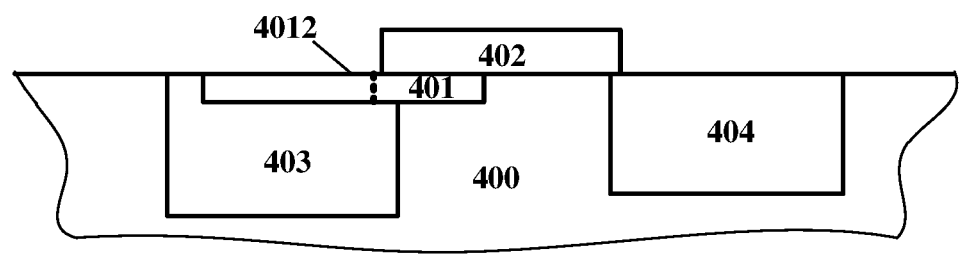

S304: generating an electric potential adjustment layer in the epitaxial layer. Specifically, a P-type material is injected into the channel threshold adjustment region 401 at least once to form an electric potential adjustment layer 4012 including the channel threshold adjustment region 401, wherein the P-type material in the channel threshold adjustment region 401 of the electric potential adjustment layer 4012 has the lowest doping concentration, as shown in FIG. 7. A plurality of regions in the electric potential adjustment layer have the same depth, and the depth of the electric potential adjustment layer is one tenth of the depth of the floating diffusion node. In one or more embodiments of the present invention, boron fluoride is injected into the channel threshold adjustment region to form the electric potential adjustment layer. In order to meet the depth requirement, the energy for injecting the boron fluoride is 0.1 to 100 keV, the concentration of the doping material injected with the boron fluoride is $2\times10^{11}$ to $3.4\times10^{13}$ cm$^{-2}$, and the inclination is 0° to 2°.

It should be noted that S304 may be executed before S303, or after S303, or simultaneously with S303.

Figure 8:
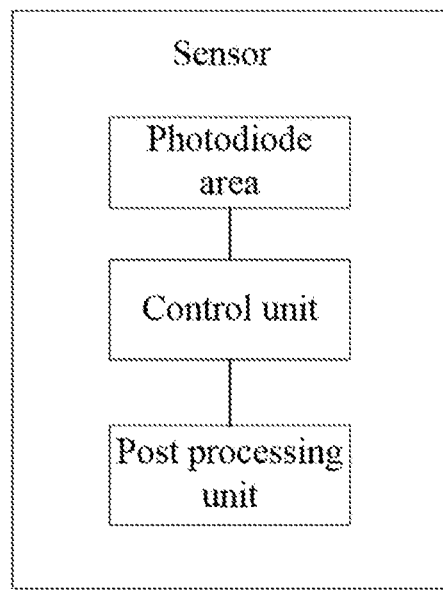
FIG. 8 illustrates a schematic structural diagram of a sensor according to one or more embodiments of the present invention.

One or more embodiments of the present invention provide a CMOS sensor exemplarily implemented. Referring to FIG. 8, the pixel unit in the CMOS sensor includes: a photosensitive unit, configured to generate a photo-generated carrier according to the received radiation; at least two transmission units, connected between the photosensitive unit and at least two floating diffusion nodes, and configured to transfer the photo-generated carrier from the photosensitive unit to the at least two floating diffusion nodes; and the at least two floating diffusion nodes, configured to store and output the photo-generated carrier generated by the photosensitive unit; wherein among the at least two floating diffusion nodes, the floating diffusion node that is spaced by more transmission units from the photosensitive unit has a lower electric potential. The pixel unit is used to perform any item provided by the embodiments corresponding to FIG. 1.

Figure 9:
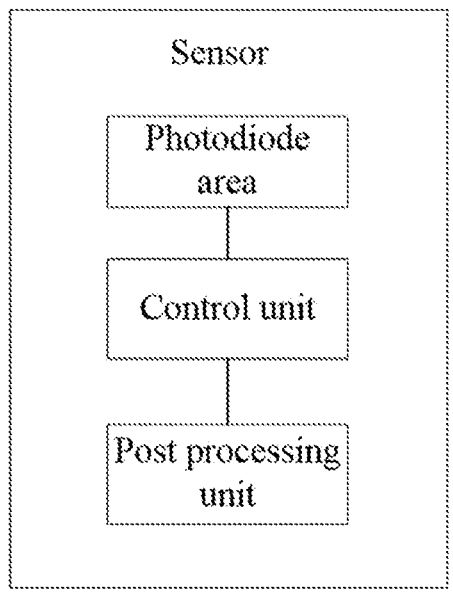
FIG. 9 illustrates a schematic structural diagram of another sensor according to one or more embodiments of the present invention.

One or more embodiments of the present invention further provide a sensor exemplarily implemented. Referring to FIG. 9, the pixel unit in the sensor includes: a photosensitive unit, configured to generate a photo-generated carrier according to the received radiation; at least two transmission units, connected between the photosensitive unit and at least two floating diffusion nodes, and configured to transfer the photo-generated carrier from the photosensitive unit to the at least two floating diffusion nodes; and the at least two floating diffusion nodes, configured to store and output the photo-generated carrier generated by the photosensitive unit; wherein among the at least two floating diffusion nodes, the floating diffusion node that is spaced by more transmission units from the photosensitive unit has a lower electric potential. The pixel unit is used to perform any item provided by the embodiments corresponding to FIG. 1.

Figure 10:
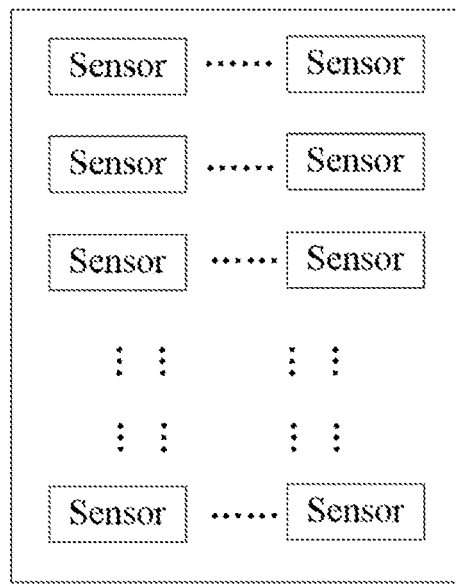
FIG. 10 illustrates a schematic structural diagram of a sensor array according to one or more embodiments of the present invention.

One or more embodiments of the present invention further provide a sensor array exemplarily implemented. As shown in FIG. 10, the sensor array includes a plurality of pixel units, and the plurality of pixel units may be sensors of any of the embodiments corresponding to FIG. 8 or FIG. 9, or the plurality of sensors may also be CMOS sensors similar to the sensor of any of the embodiments corresponding to FIG. 8 or FIG. 9. The pixel unit is used to perform any item provided by the embodiments corresponding to FIG. 1.

It should be noted that although several units/modules or subunits/modules of the device are mentioned in the above detailed description, this division is merely exemplary but not restrictive. In practice, the features and functions of two or more units/modules described above according to one or more embodiments of the present invention may be embodied in one unit/module. Conversely, the feature and function of one unit/module described above may be further divided and embodied by a plurality of units/modules. Furthermore, although the operations of the methods of the present invention are described in specific orders in the drawings, this does not require or imply that the operations must be performed in the specific orders, or that all the operations shown must be performed to achieve the desired results. Additionally or alternatively, some steps may be omitted, a plurality of steps may be combined into one step for execution, and/or one step may be split into a plurality of steps for execution. Although the spirit and principle of the present invention have been described with reference to several specific embodiments, it should be understood that the present invention is not limited to the disclosed specific embodiments, the division of various aspects does not mean that the features in these aspects cannot be combined to benefit, and this division is just for convenience of expression. One or more embodiments of the present invention is intended to cover various modification and equivalent arrangements included within the spirit and scope of the appended claims.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A pixel unit, comprising:
   a photosensitive unit, configured to generate a photo-generated carrier according to received radiation;
   at least two transmission units, connected between the photosensitive unit and at least two floating diffusion nodes, and configured to transfer the photo-generated carrier from the photosensitive unit to the at least two floating diffusion nodes; and
   the at least two floating diffusion nodes, configured to store and output the photo-generated carrier generated by the photosensitive unit,
   wherein among the at least two floating diffusion nodes, the floating diffusion node that is spaced by more transmission units from the photosensitive unit has a lower electric potential,
   wherein the at least two floating diffusion nodes comprise at least one floating diffusion node provided with a charge storage region and an electric potential adjustment layer, the electric potential adjustment layer is arranged at a surface of the charge storage region, and the electric potential adjustment layer comprises a channel threshold adjustment region disposed furthest away from the photosensitive unit,
   and wherein in the electric potential adjustment layer, a P-type material in the remaining region other than the channel threshold adjustment region is non-uniformly doped so that a doping concentration of the P-type material in the electric potential adjustment layer decreases in a direction in which the electric potential decreases.

2. The pixel unit according to claim 1, wherein a region in the electric potential adjustment layer that is disposed further away from the photosensitive unit has a lower electric potential.

3. The pixel unit according to claim 1, wherein the channel threshold adjustment region has the lowest electric potential.

4. The pixel unit according to claim 3, wherein the channel threshold adjustment region is arranged within a coverage of the transmission unit connected between the at least two floating diffusion nodes.

5. The pixel unit according to claim 1, wherein the transmission units connected between the photosensitive unit and the at least two floating diffusion nodes are connected to a surface of the charge storage region.

6. The pixel unit according to claim 1, wherein each of the at least two floating diffusion nodes has the same depth; and wherein the pixel unit further comprises a substrate epitaxial layer, and the depth of the at least two floating diffusion nodes is one fiftieth to one tenth of a depth of the substrate epitaxial layer.

7. A CMOS sensor comprising the pixel unit according to claim 1.

8. A sensor comprising the pixel unit according to claim 1.

9. A sensor array comprising a plurality of the CMOS sensors according to claim 7.

10. The pixel unit according to claim 3, wherein the channel threshold adjustment region has the lowest doping concentration of the P-type material.

\* \* \* \* \*